US006032113A

United States Patent [19]

Graupe

[11] Patent Number: 6,032,113
[45] Date of Patent: Feb. 29, 2000

[54] N-STAGE PREDICTIVE FEEDBACK-BASED COMPRESSION AND DECOMPRESSION OF SPECTRA OF STOCHASTIC DATA USING CONVERGENT INCOMPLETE AUTOREGRESSIVE MODELS

[75] Inventor: Daniel Graupe, Highland Park, Ill.

[73] Assignee: Aura Systems, Inc., El Segundo, Calif.

[21] Appl. No.: 08/944,038

[22] Filed: Sep. 29, 1997

Related U.S. Application Data

[60] Provisional application No. 60/027,569, Oct. 2, 1996.

[51] Int. Cl.[7] .............................. G10L 9/00; H03M 7/30

[52] U.S. Cl. .......................... 704/201; 704/501; 704/504; 341/56

[58] Field of Search ..................................... 704/200, 201, 704/203, 204, 219, 222, 226, 229, 265, 500, 501, 503, 504

[56] References Cited

U.S. PATENT DOCUMENTS

| | | | |
|---|---|---|---|
| 5,142,581 | 8/1992 | Tokuda et al. | 704/226 |
| 5,243,686 | 9/1993 | Tokuda et al. | 704/200 |
| 5,477,272 | 12/1995 | Zhang et al. | 348/407 |
| 5,673,210 | 9/1997 | Etter | 702/69 |
| 5,737,484 | 4/1998 | Ozawa | 704/222 |
| 5,774,839 | 6/1998 | Shlomot | 704/222 |
| 5,826,232 | 10/1998 | Gulli | 704/267 |

*Primary Examiner*—David R. Hudspeth
*Assistant Examiner*—Martin Lerner
*Attorney, Agent, or Firm*—Sitrick & Sitrick

[57] ABSTRACT

The spectral range of a stochastic time series of information, including unvoiced speech is reduced to allow transmission over a substantially narrowed frequency band. Sets of autoregressive (AR) parameters are identified for successive time windows of the original time series and of subsequent stages of subsampled reduced-spectrum models of each window of the original time series are used. The AR parameters are transmitted together with subsampled windows of the original data. These AR parameters are used to reconstruct a least square stochastic estimate of the transmitted subsampled time series in a backwards manner from the most subsampled spectrum back to the original spectrum using a sequence of predictive feedback algorithms. Past prediction outputs are feedback for prediction whenever samples are missing. This process yields a high quality reconstructed signal that preserves not only speech parameters and intelligibility, but also near-natural speaker identifiability.

32 Claims, 2 Drawing Sheets

N-STAGE PREDICTIVE FEEDBACK-BASED COMPRESSION AND DECOMPRESSION OF SPECTRA OF STOCHASTIC DATA USING CONVERGENT INCOMPLETE AUTOREGRESSIVE MODELS

RELATED APPLICATIONS

This application claims priority from provisional application Ser. No. 60/027,569 filed Oct. 2, 1996.

FIELD OF THE INVENTION

This invention relates to signal processing, and more particularly, to predictive feedback-based compression and decompression.

BACKGROUND OF THE INVENTION

The compression of speech, in view of the possible economic gains, has attracted considerable attention. H. W. Dudley's dedicated efforts in this area during his 40 years at Bell Telephone Laboratories and his contributions from the basis for most subsequent work regarding conventional vocoders. H. W. Dudley, "The Vocoder", Bell Laboratories Record, Vol. 17, 1939.

The conventional band-compression speech system based on analysis-synthesis experiments of Dudley was called vocoder (voice coder) and is now known as the spectrum channel vocoder.

Other vocoder systems have been built wherein the pitch and excitation information is either extracted, coded, transmitted, and synthesized, or transmitted in part and expanded as in the voice-excited methods. The amplitude spectrum may be transmitted by circuits that track the formants, determine which of a number of present channels contain power and to what extent, or determine its amplitude spectrum by some suitable transform such as the correlation function, and transmit and synthesize the spectrum information by such means. These approaches give rise to such systems as the auto correlation vocoder, the formant vocoder, and the voice-excited formant vocoder.

Many other methods of speech compression have been tried, such as frequency division multiplication and time compression and expansion procedures, but these systems generally become more sensitive to transmission noise. See "Reference Data for Radio Engineers", 6th Ed. H. Sams 1982, p.37–33 to 37–36. For examples of these conventional vocoder techniques and attendant problems, look to "Digital Coding of Speech Waveforms" by N. S. Jayant, Proceedings of the IEEE, Vol. 62, pp. 611–632, May, 1974.

The advantages of coding a signal digitally are well-known and are widely discussed in the literature. Briefly, digital representation offers ruggedness, efficient signal regeneration, easy encryption, the possibility of combining transmission and switching functions, and the advantage of a uniform format for different types of signals. The price paid for these benefits is the need for increased bandwidths.

More recent research has produced a linear predictive analysis given a sampled (discrete-time) signal s(n), a powerful and general parmetric model for time series analysis which is, in that case, a signal prediction or reconstruction model, give by:

$$s(n) = -\sum_{k=1}^{p} a(k)s(n-k) + G\sum_{l=0}^{q} b(l)u(n-l)$$

where s(n) is the outputand u(n) is the input (perhaps unknown). The model parameters are a(k) for k=1, p, b(l) for l=1, q, and G, b(0) is assumed to be unity. This model, described as an autoregressive moving average (ARMA) or pole-zero model, forms the foundation for the analysis method termed linear prediction. An autoregressive (AR) or all-pole model, for which all of the "b" coefficients except b(0) are zero, is frequently used for speech analysis. In the case of stochastic signals, such as speech, u(k) can be shown to be equivalent to inaccessible white noise without loss of generality, as is the usage in this description. (see, Chapter 4 of Graupe, "Time Series Analysis Identification and Adaptive Filtering", Krieger Publishing Co., Malabar, Fla., 1989 (2nd edition)).

In the standard AR formation of linear prediction, the model parameters are selected to minimize the means-squared error between the model and the speech data. In one of the variants of linear prediction, the auto correlation method, the minimization is carried out for a windowed segment of data. In the auto correlation method, minimizing the means-square error of the time domain samples is equivalent to minimizing the integrated ratio of the signal spectrum to the spectrum of the all-pole model. Thus, linear predictive analysis is a good method for spectral analysis whenever the signal is produced by an all-pole system. Most speech sounds fit this model well. One key consideration for linear predictive analysis is the order of the model, p. For speech, if the order is too small, the formant structure is not well represented, If the order is too large, pitch pulses as well as formants begin to be represented. Tenth- or twelfth-order analysis is typical for speech. See, "The Electrical Engineering Handbook", pp. 302–314, CRC Press, 1993.

Telephone quality speech is normally sampled at 8 KHz and quantized at 8 bit/sample (a rate of 64 kbits/s) for uncompressed speech. Simple compression algorithms like adaptive differential pulse code modulation (ADPCM) use the correlation between adjacent samples to reduce the number of bits used by a factor of two to four or more with almost imperceptible distortion. Much higher compression ratios can be obtained with linear predictive coding (LPC), which models speech as an autoregressive process, and send the parameters of the process as opposed to sending the speech itself. One reference for LPC is "Neural Networks for Speech Processing", by D. P. Morgan and C. L. Scofield, Chapter 4, Kluger Publishing, Boston, Mass., 1991. With conventional LPC-based methods, it is possible to code speech at less than 4 kbits/s. At very low rates, however, the reproduced speech sounds synthetic and the speaker's identifiability is totally lost. The present invention successfully overcomes these obstacles allowing heretofore unknown bit rates and speech sound quality.

SUMMARY OF THE INVENTION

The present invention avoids the problems inherent in conventional vocoders and compression techniques. In accordance with the present invention, the spectral range of a stochastic time series signal (such as a speech time series) is reduced to allow its transmission over a frequency band that is substantially narrower than the band over which the time series carries information with a minimal effect on information quality when the transmitted information is reconstructed at the receiving end. This is achieved through a combination of vocoder-like reconstruction of speech from AR parameters and keeping a reduced set of original speech samples. This allows reconstruction of speech with considerable speaker identifiability.

These and other aspects and attributes of the present invention will be discussed with reference to the following drawings and accompanying specification. In the context of this invention, signal reconstruction models are signal prediction models.

DETAILED DESCRIPTION OF THE PREFERRED EMBODIMENT

Figure 1:
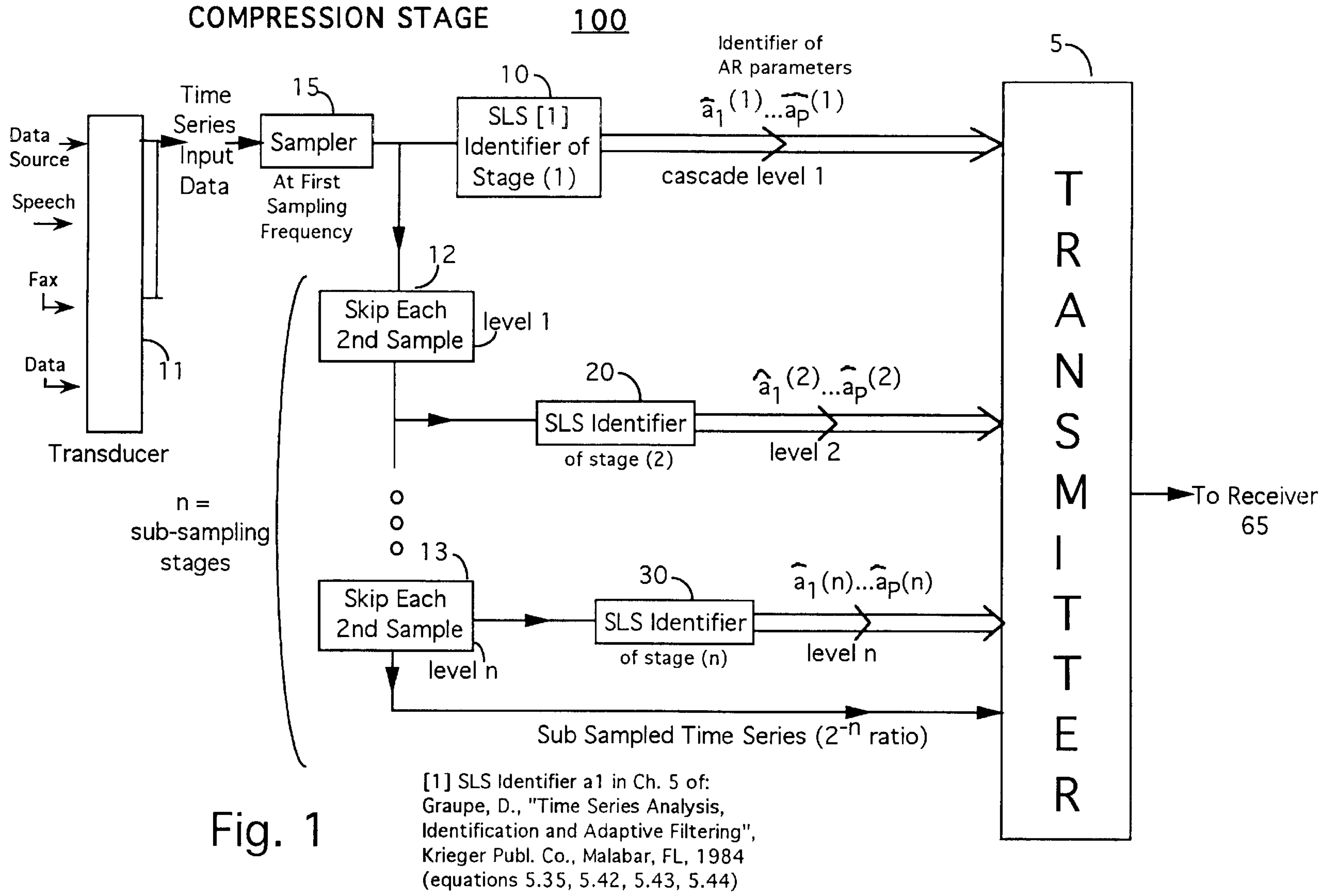
FIG. 1 shows a block diagram of the compression stage of the system provided by the invention.

While this invention is susceptible of embodiment in many different forms, there is shown in the drawings, and will be described herein in detail, specific embodiments thereof with the understanding that the present disclosure is to be considered as an exemplification of the principles of the invention and is not intended to limit the invention to the specific embodiments illustrated.

The present invention sets forth a Linear Time Series (TS) Model (Linear Model) for signal prediction, which satisfies:

$$\sum_i \alpha_i x_{k-i} = \sum_j \beta_j w_{k-j}$$

where $\alpha$=AR (autoregressive) parameters
$\beta$=MA (moving—average) parameters
$x_k$=signal at time k
k=1, 1, 2, . . . discrete time
where $w_k$ is inaccessible, white noise; i.e., where the energy of $w_k$ is $E[w^2_k]=W$ and $w_k=E[w_k]=0$; $E[w_k w_l]=0\ \forall k\neq l$.

This definition unifies the AR, MA, and ARMA models as set forth by the definitions below.

Linear Process: A process represented by $$\sum_i \alpha_i x_{k-i} = \sum_i \beta_j w_{k-j};$$

wherein $w_k$ is a statistically independent and identically distributed process.

AR Model (Autoregressive):

$$\sum_i a_i x_{k-i} = w_k;\ w_k = \text{white noise}$$

$w_k$=white noise
namely, where $\triangleq$ means "equals by definition", $$\left(\sum_i a_i B^i\right) x_k \triangleq a(B) x_k = w_k$$

where B is a unit-sample delay operator such that $$B^i x_k \triangleq x_{k-1}$$

MA Model (Moving-Average):

$$x_k = \sum_i \beta_j w_{k-j};\ w_k = \text{white noise}$$

$w_k$=white noise
namely, $$x_k=\beta(B)w_k.$$

ARMA Model (Autoregressive Moving Average):

$$\sum_i \phi_i x_{k-i} = \sum_j \theta_j w_{k-j};\ w_k = \text{white noise}$$

$w_k$=white noise
namely, $$\phi(B)x_k=\theta(B)w_k$$

such that $$\frac{\phi(B)}{\theta(B)} = \alpha(B)$$

and $$\frac{\theta(B)}{\phi(B)} = \beta(B) = \frac{x_k}{w_k} = \text{discrete transfer function}$$

(For other representative examples, See chapters 2, 4, and 5 of Graupe, D., "Time Series Analysis Identification and Adaptive Filtering", Krieger Publishing Co., Malabar, Fla. 1984 and 1989, herein incorporated by reference.)

One must first identify sets of autoregressive (AR) parameters for successive time windows of the original time series and of subsequent stages of 2:1 subsampled reduced-spectrum models of each such window of a corresponding original time series. This is accomplished by using statistically efficient and fast convergent minimum-variance reclusive sequential least square (SLS) or batch minimum-variance least square (LS) identification subsystems in accordance with the present invention as set forth below.

Consider the AR model above. In order to perform a least squares (LS) identification of the parameter vector a, we define a LS identification error cost, which is the LS "cost" of the error in predicting $x_k$ via the identified estimates of $\hat{a}$ of a, considering a set of r observations, as:

$$J_r=(\underline{x}-U\hat{a}_r)^T(\underline{x}-U\hat{a}_r)=tr[(\underline{x}-U\hat{a}_r)(\underline{x}-U\hat{a}_r)^T]$$

where $$x^T \triangleq [\, x_k \ \cdots \ x_{k-r+1} \,]$$

$$U \triangleq \begin{bmatrix} x_{k-1} & \cdots & x_{k-n} \\ x_{k-2} & \cdots & x_{k-n-1} \\ & \vdots & \\ x_{k-r} & \cdots & x_{k-n-r+1} \end{bmatrix}$$

-continued $$a^T \triangleq [\, a_1 \ \cdots \ a_n \,]^T$$

n being the dimension of a.

$$\left[x - U\hat{a}_r\right] \triangleq \begin{bmatrix} x_k - \sum_{i-1}^{n} \hat{a}_{r,i} x_{k-1} \\ x_{k-1} - \sum_{i} \hat{a}_{r,i} x_{k-i-1} \\ \vdots \\ x_{k-r+1} - \sum \hat{a}_{r,i} x_{k-i-r+1} \end{bmatrix}$$

where $\hat{a}_{r,i}$ is the estimate (identification) of $a_i$ via r observations. Denoting $$\tilde{x}_{k-j+1} \triangleq x_{k-j+1} - \sum_{i=1}^{n} \hat{a}_{r,i} x_{k-1-j+1}; \qquad j = 1, 2, \ldots r$$

then the cost $J_r$ is a summed LS cost, namely:

$$J_r = \sum_{j=1}^{r} (\tilde{x}_{k-j+1})^2 = x^T x$$

$$x_k^T \triangleq [\, \overline{x}_k \ \cdots \ \overline{x}_{k-r+1} \,]$$

The LS estimate (identification $\hat{a}_r$ of a) thus satisfies $$\hat{a}^{min}{}_r J_r$$

namely $$\frac{\partial Jr}{\partial \hat{a}_r} = 0 \Rightarrow \hat{a}_r(LS)$$

such that:

$$\hat{a}_r(LS) = (U^T U)^{-1} U^T x.$$

To avoid the numerical difficulties of matrix inversion and to overcome the problem of having to await the collection of r>>n data sets prior to obtaining the first LS estimate, we shall present an LS algorithm that makes use of the matrix inversion lemma (See, Chapter 5 of Graupe, "Time Series Analysis Identification and Adaptive Filtering", Krieger Publishing Co., Malabar, Fla., 1989 (2nd Edition) such that no matrix inversion is performed (to avoid matrix ill-conditioning) and which is recursive in nature. This algorithm, known as the Sequential Least Squares (SLS) algorithm is derived as follows:

Reconsider the structure of the AR equation, namely, $$x_k = \sum_{i=1}^{n} a_i x_{k-1} + w_k \tag{Eq. 1.1}$$

$w_k$ being inaccessible white noise. Note that the structure is equally applicable to this derivation noting the definitions of $x_k$ and $w_k$ above. Hence, and to avoid repetition, the present derivation can be rederived under the structure with only redefining x accordingly.

Now, $\hat{a}_r$ satisfies:

$$\left(\sum_{k=1}^{r} x_k x_k^T\right)\hat{a}_r = \sum_{k=1}^{r} x_k x_k, \tag{Eq. 1.2}$$

defining:

$$P_r^{-1} \triangleq \sum_{k=1}^{r} x_k x_k^T \tag{Eq. 1.3}$$

$P_r$ being invertible only for r≧nas discussed above, becomes $$P_r^{-1}\hat{a}_r = \sum_{k=1}^{r} x_k x_k \tag{Eq. 1.4}$$

namely, $$\hat{a}_r = P_r \sum_{k=1}^{r} x_k x_k. \tag{Eq. 1.5}$$

We note that eq. 1.5 can be broken down to:

$$P_r^{-1}\hat{a}_r = \sum_{k=1}^{r-1} x_k x_k + x_r x_r. \tag{Eq. 1.6}$$

Furthermore, substituting r−1 for r, eq. 1.2 may be rewritten as:

$$\sum_{k=1}^{r-1} x_k x_k = \left(\sum_{k=1}^{r-1} x_k x_k^T\right)\hat{a}_{r-1} \tag{Eq. 1.7}$$

Now, substituting for $$\sum_{k=1}^{r-1} x_k x_k$$

from eq. 1.7 into 1.6, we obtain:

$$P_r^{-1}\hat{a}_r = \left(\sum_{k=1}^{r-1} x_k x_k^T\right)\hat{a}_{r-1} + x_r x_r. \tag{Eq. 1.8}$$

Subsequently, adding and subtracting $x_r x_r^T \hat{a}_{r-1}$ at the right hand of the equation yields:

$$P_r^{-1}\hat{a}_r = \left(\sum_{k=1}^{r-1} x_k x_k^T\right)\hat{a}_{r-1} + x_r(x_r - x_r^T\hat{a}_{r-1}) + x_r x_r^T \hat{a}_{r-1} \tag{Eq. 1.9}$$

such that by rearrangement of terms of the equation becomes:

$$P_r^{-1}\hat{a}_r = \left(\sum_{k=1}^{r} x_k x_k^T\right)\hat{a}_{r-1} + x_r(x_r - x_r^T\hat{a}_{r-1}). \tag{Eq. 1.10}$$

Considering the definition of $P_r^{-1}$, the equation may be written as:

$$P_r^{-1}\hat{a}_r = \left(\sum_{k=1}^{r} x_k x_k^T\right)\hat{a}_{r-1} + x_r(x_r - x_r^T\hat{a}_{r-1}) \qquad \text{(Eq. 1.11)}$$

to yield:

$$\hat{a}_r=\hat{a}_{r-1}+P_r x_r(x_r-x_r^T\hat{a}_{r-1}). \qquad \text{(Eq. 1.12)}$$

The equation thus yields $a_r$ in terms of $a_{r-1}$, i.e., in terms of the previous estimate (based on one less data set), and in terms of a correction term which is a function of the prediction error $x_r-x_r^T a_{r-1}$ when using the previous estimate. This is, of course, still exactly the LS estimate though derived recursively. Our derivation is, however, not yet complete since we must still attend to deriving $P_r$ since only $P_r^{-1}$ is given, and we wish to avoid matrix inversion (to avoid matrix ill-conditioning, i.e., when matrix ill-conditions its output is infinity (See, Chapter 5 of Graupe, "Time Series . . . " ibid). The derivation of $P_r$ is as follows:

$$P_r^{-1} = \sum_{k=1}^{r-1} x_k x_k^T + x_r x_r^T = P_{r-1}^{-1} + x_r x_r^T \qquad \text{(Eq. 1.13)}$$

multiplying both sides of the equation by $P_r$ at the left yields:

$$I=P_r P^{-1}_{r-1}+P_r x_r x_r^T \qquad \text{(Eq. 1.14)}$$

Similarly, multiplying the equation by $P_{r-1}$ at the right gives:

$$P_{r-1}=P_r+P_r x_r x_r^T P_{r-1}. \qquad \text{(Eq. 1.15)}$$

By further multiplying the equation at the right by $x_r$, we obtain $$P_{r-1}x_r=P_r x_r+P_r x_r x_r^T P_{r-1} x_r=P_r x_r(1+x^T_r P_{r-1} x_r) \qquad \text{(Eq. 1.16)}$$

the bracketed term in the equation being a scalar. Hence multiplying the equation by $(1+x_r^T P_{r-1} x_r)^{-1} x_r^T P_{r-1}$ at the right, yields:

$$\frac{P_{r-1} x_r x_r^T P_{r-1}}{1 + x_r^T P_{r-1} x_r} = P_r x_r x_r^T P_{r-1} \qquad \text{(Eq. 1.17)}$$

But, by equation (1.15)

$$P_r x_r x_r^T P_{r-1}=P_{r-1}-31\ P_r \qquad \text{(Eq. 1.18)}$$

Therefore, the equation (1.17) becomes:

$$P_r = P_{r-1} - \frac{P_{r-1} x_r x_r^T P_{r-1}}{1 + x_r^T P_{r-1} x_r}. \qquad \text{(Eq. 1.19)}$$

(See also the above cited examples in Chapter 5 of Graupe) and then transmitting the AR parameters as identified at all stages above together with the subsampled windows of the original data, and finally employing these AR parameters to reconstruct a least square minimum variance stochastic estimate of the transmitted subsampled time series in a backwards manner from the most subsampled spectrum back to the original spectrum using a sequence of predictive feedback algorithms that is based both on the identified AR parameters above for each subsampling level that is employed, and whether past prediction outputs are feedback to the prediction whenever samples are missing.

Note also that prediction of $x_r$ is thus afforded via the AR model of equation 1.1, when $a_i$ are as identified above, and the inaccessible $w_k$ is considered to be zero to make it the prediction error, that can be shown to be of minimum variance.

Each compression stage of the present invention provides 2:1 compression, and each decompression is correspondingly a 1:2 decompression that guarantees covergence of prediction. (Note that the feedback prediction output at each decompression stage is the reconstructed output for that stage.) A recursive identifier is preferably employed, having statistically efficient properties, where the output of each 2:1 compression stage is the input of the next compression stage to achieve $2^n$:1 compression in n stages as set forth in detail hereinbelow.

The present invention exhibits novel convergence properties and statistically efficient properties, with excellent reconstructive convergence ability, even with considerably incomplete data samples (such as, for example, 3 missing data points out of ever 4) due to the subsampling. The delay between transmission and reconstruction is typically equal to d=1+m*n*s, where s is the number of AR parameters in each predictor model, all being of the same order (usually s=3) and n being the number of compression stages involved, when a subsampling by a factor of 2 is performed at each stage; and m being a repeatability factor chosen between 1 and 4.

Hence, for a 2 stage compression, namely a compression by a factor of $2^n$=4, with m=2 and s=3, a delay of 13 samples is involved. Therefore, for example, when utilizing a sampling rate of 4000 samples per second, corresponding to a bandwith of 2 KHz, the delay is only 3.25 milliseconds. Details of the operation of a preferred embodiment of the invention is set forth below.

The present novel compression approach differs from a conventional vocoder based compression system in that, among other things, not only are speech parameters, such as AR parameters being transmitted and received, but so are signal samples. The invention also differs from conventional predictor based compression methods recited above in that for missing data, reconstruction based on conventional AR parameter approaches usually does not guarantee convergence to an adequate minimum variance of prediction error (error between the original and reconstructed signal) when compression is by a factor higher than 2. The present invention avoids this convergence problem by first employing AR estimates coming from statistically efficient and hence theoretically fastest convergent identifiers (as discussed hereinabove), such that even for relatively short data windows, parameters will converge very close to the actual but unknown parameters. This is achieved by the present invention via cascading of 1-step AR predictors, each predictor keeping its own true AR parameters.

In a preferred embodiment, the derivation of the AR parameters at each level of compression further provides for derivation of the signal power value (or energy level) for that level of compression. The sample points from the final compression level and the AR parameters for all compression levels and the signal power value are combined to provide a compressed signal output. On decompression, the AR parameters for all levels, plus the final compression stage sample points and the signal power values are utilized to reconstruct the original signal.

As shown in FIG. 1, transducer subsystem 11 receives input from speech, fax, or data. In the case of speech, the sound energy is converted to electrical form; in the case of fax, the image on the page is transduced to an electronic form and so forth as is well known in the art. The transducer 11 outputs time series data which is in continuous in time and is being sampled by the sampler 15. The output from the sampler 15 is cascaded for multiple levels of cascading, wherein each cascading stage (level 1, 2, 3, . . . ) provides for a 2:1 data reduction by subsampling. Three levels or stages of subsampling systems are illustrated, 10, 12 and 13. In a preferred embodiment, three to six levels are employed. Each level (or stage) has an identifier for that stage, illustrated as SLS identifiers. In general, any identifier is more or less equivalent. The parameters are obtained by the identifier for each of the different stages (10, 20, and 30 of FIG. 1) and also the most reduced subsample series from the bottom of the cascade of the subsampled series, are all combined to form the encoded data that the transmitter 5 transmits to be ultimately received by the receiver.

The transmitter subsystem 5 provides for combination of the identifiers or parameters from each of the cascade levels. This combination has a coded form. For example, the first 128 bits are the data output of sampler stage 13 (which is the subsampled time series output after multiple 2:1 ratio subsampling). The next 128 bit block or groups of blocks are the parameters for subsampling each of the levels. While FIG. 1 illustrates three levels as illustrative of animal configuration, improvements continue with increased levels, such that five or more levels provides an excellent yield.

While FIG. 1 illustrates with five parameters (i.e., $a_1$–$a_5$), the number of parameters does not need to be limited to 5, as they range in general from $a_1$–$a_p$, where p is an integer larger than 2. The output of the transmitter 5 is coupled (e.g., broadcast) via a chosen modality to a corresponding receiver for receipt thereby (e.g. optical, wired, wireless, RF, microwave, etc.). The receiver 65 then provides the encoded data for coupling to a decompression stage as is illustrated in FIG. 2.

Figure 2:
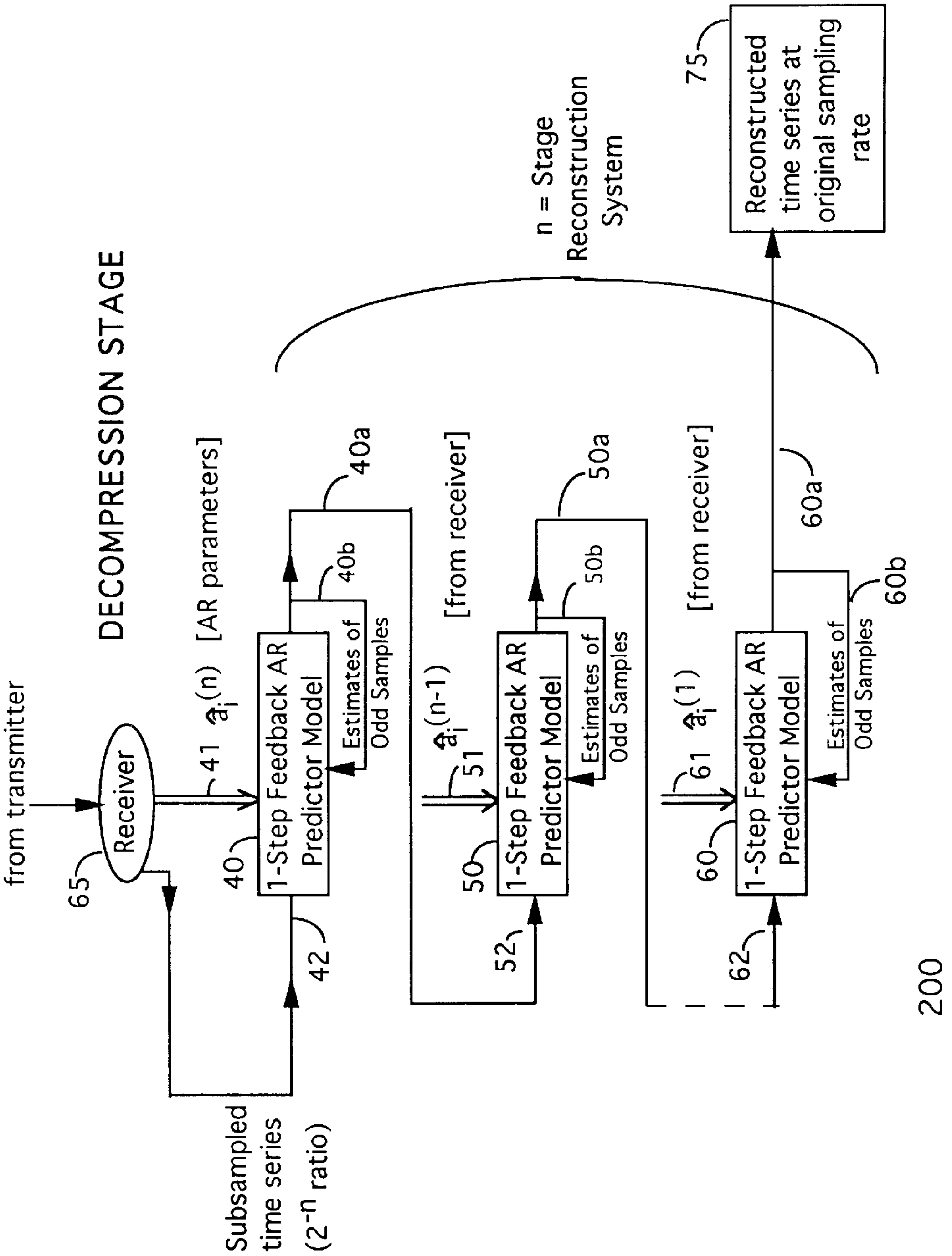
FIG. 2 shows a block diagram of the decompression stage of the present invention.

Referring to FIG. 2, the information from the transmitter 5 is coupled to the receiver 65 which reconstructs the data signal and parameters based on the model and formatting used by the transmitter 5 and its compression stages. The output of the receiver 65 and of each decompression subsystems 40 and 50 is comprised of (1) the AR parameters (2) as separated from the data. The separated AR parameters 41, 51, and 61 and the data 42, 52, and 62, respectively, are then provided to each of the cascade decompression levels 40, 50, and 60, respectively, as illustrated. The output 40*a*, 50*a*, and 60*a* of each of the cascade levels decompression subsystems (40, 50, and 60, respectively) is fed forward to the next cascade level. Additionally, each decompression subsystem outputs estimates of odd samples being fed back (40*b*, 50*b*, and 60*b*) from the current cascade level of itself. This is accomplished in accordance with the reconstruction decompression algorithm as discussed herein above.

At the end of a cascade of reconstruction from a decompression, as output from stage 60, a reconstructed time series is output from the reconstruction output interface subsystem 75. The reconstruction subsystem 75 provides for reconstruction by taking the outputs from the final cascade stage 60 as the final data comprising the reconstructed data samples which are then reconstructed at stage 75 in accordance with the type of original signal it was, for example, speech is reconstructed from speech, fax images are reconstructed from fax data, etc.

At each decompression stage of the present invention, the number of samples is doubled, based on the samples coming in (i.e., coupled to that stage as inputs) and in filling in between every two samples (i.e.,by computing an estimated sample from the AR parameters using the described model). For example, stage 1 40 has as input m samples 42, whereas the output of stage 40 is 2m samples 52 provided as an input to stage 2 50 which provides an output of 4m samples 52 out to stage 3 60 which provides an output of 8m samples 60*a* to be reconstructed. The added samples in each stage are those obtained from the AR predictor model whereas the other half of the samples are samples that originally came into that stage. The signal 41 from the receiver 65 represents the AR parameters input to the first cascade stage 40. The data samples are coupled via input 42 to the cascade stage 40.

Using the data and the AR parameters, the cascade stage 40 reconstructs the missing odd samples and provides an output 40*a* which is comprised of the reconstructed AR parameters and samples, as well as the original samples and AR parameters as coupled from the receiver 65. This output 40*a* is coupled to the next cascade stage 50 as AR parameters 51 and data samples 52. In a like manner, stage 50 provides an output 50*a* comprising the data samples and AR parameters which are coupled as AR parameters 61 and data samples 62 to the cascade stage 60 to provide the final reconstructed data samples 60*a* which is coupled the reconstruction subsystem 75.

Referring to FIGS. 1 and 2, limiting prediction to a one-step-feedback-prediction, guarantees convergence by using a recursive multistage compression/decompression system 100, 200. As shown in FIGS. 1 and 2, each stage 10–60 employs a 2:1 compression/decompression. As shown in FIG. 2, during decompression, each recursion 40, 50, 60, yields a corresponding convergent decompression output 40*a*, 50*a*, 60*a* with a minimal error variance due to only a single missing data point in each prediction-equation step (namely the AR equation for each sample). This missing data point is replaced by feeding back the previous theoretically convergent estimate 40*b*, 50*b*, 60*b* of the data point is obtained from the previous feedback prediction step.

Therefore, each decompression-prediction stage 40–60 of the invention is convergent in itself such that the totality of n-stage decompression-prediction is also convergent. As one of ordinary skill can appreciate, the more data points that are missing, the higher the bias to which prediction converges. Recursive predictions utilizing a single missing data point per each predictive decompression stage 40–60 with statistically efficient parameter estimates 40*b*–40*b* (identification) of the actual uncompressed data provides excellent convergence even for high n.

For a specific sampling frequency $f_{s1}$ and window length $K_1$ at that frequency and a specific N (number of compression stages), then At the transmitting side:

(1) for j=1 select a window of $K_1$ samples at sampler 15, then (2) sample $s_{kj}$ at sampling frequency $f_{sj}$ denoting these samples as: $y^{(j)}(k_j)$; ($k_j$=0, 1, 2, . . .$K_j$); $K_j=\frac{1}{2}K_{j-1}$; j<1

(3) Identify $a_i$ of an AR model of order S for $y^{(j)}(k_j)$ denoted as $a_i^{(j)}$(i=1, 2, . . . S). For example, in SLS identification, using equations 1.12 and 1.19 and $\hat{a}(0)=0$ and $P(0)=\beta I$; $\beta<<1$ for initialization, I being a unity matrix.

(4) Skip each odd sample of $y^{(j)}(k_j)$ to yield $y^{(j+1)}(k_{j+1})$; ($k_{j+1}$=0, 1, . . . $K_{j+1}$) such that $y^{(j+1)}(k_{j+1}=k_j/2)=y^{(j)}(k_j)$ (5) if $j \leqq N-1$, set $j=j+1$, go to (3) Else go to (6)

(6) Transmit $y^N(k_N)$, $a_i^{(1)} \ldots a_i^{(N)}$ using transmission means 5

Note: The input time series $y_{k1}$ is transmitted in (6) at a sampling rate of $f_{sN}=f_{s1}/2^N$, N denoting the number of compression stages that are employed.

At the receiving side:

(1) Via a receiver means 65 receive $a_i^{(1)} \ldots a_i^{(N)}$, $y^N(k_N)$, then for j=N, set $\hat{y}^N(k_N)=y^N(k_N)$ and for j=N do (2) Employ $y^{(j)}(k_j)$ to reconstruct $\hat{y}^{(j-1)}(k_{j-1})$ where $$\hat{y}^{(j-1)}(k_{j-1}) = \sum_{i=1}^{n} a_i^{(j)} \hat{y}^{(j-1)}(k_{j-1})$$

but where, at each even $k_{j-1}$: $\hat{y}^{(j-1)}k_{(j-1,\ even)}=\hat{y}^{(j-1)}(2k_j)=\hat{y}^{(j)}(k_j)$ (3) if $j \leqq 2$, set $j=j-1$; go to (2) Else go to (4)

(4) Transfer $\hat{y}^{(1)}(k_1)$; $k_1=0, 1, 2 \ldots K_1$ to receiver's 65 output 75 in sequence.

Note:

1. Lower sampling frequency relates to highest j
2. $s_{k1}$ is the input time series (at highest sampling rate)
3. The receiver's 65 output 75 is the reconstructed form of the input time series when using $\frac{1}{2}^N$ of the total number of samples that are present in the input time series.

One of ordinary skill can readily appreciate that any suitable transmitter 5 means (Tx) and receiver (Rx) 65 or transceiver (not shown) can be utilized by the present invention as a platform to carry out the necessary data communication, each carrying out the corresponding novel compression/decompression in accordance with the provisions of the present invention. For example, Tx and Rx can be formed of any appropriate data transmission and reception devices respectively, such as in radio or telephone communication.

A compression section 100 (FIG. 1) encompasses the sampler 15 and the corresponding compression stages 10, 20, and 30. A decompression section 200 (FIG. 2) includes decompression stages 40*a*, 50*a*, and 60*a*. Either or both sections 100, 200 can be implemented with a Digital Signal Processor (DSP), or a hybrid use of a microprocessor and support circuitry (not shown) and can further optionally be integrated into the transmitter 5 or receiver 65 as user needs require. Alternatively, the present invention could readily be implemented as a "stand alone" accessory to a communication system. Such a stand alone option could include embodiments implemented in a custom integrated circuit (ASIC) or inclusion in an ASIC firmware application.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed is:

1. A signal compression system for processing an input signal to provide an output of a compressed input signal, said system comprising:

means for dividing the input signal into a plurality of time windows comprising at least N=128 sample points;

means for sampling each said window at a plurality of points N at a defined sampling frequency to provide first N level 1 sampling points;

means for deriving AR (autoregressive) model level 1 parameters including signal power value responsive to the N level 1 sample points;

means for selecting every other one of the first N level 1 sample points to provide an output of level 1 of N/2 level 2 sample points;

means for deriving AR level 2 parameters responsive to the N/2 level 2 sample points, which is output from the previous level;

sampling means for selecting every other one of the sample points for level m where m equals an integer from 2 to M, where M is an integer, to provide $N/2^m$ level m+1 sample points;

deriving means for deriving AR model level m+1 parameters for $N/2^m$ level m+1 sample points which is output from level m;

means for determining the value of m relative to the value of M;

wherein for m>M, the value of m is incremented and the sampling means and the deriving means both function responsive to said incremented value of m, and reiterating for all values of m less than M;

wherein where m=M, the system is further comprised of:

means for selecting every other one of the level m sample points to provide $N/2^m$ level m+1 sample points;

means for combining the $N/2^m$ level m+1 sample points with the AR parameters of levels 1, 2, . . . M to correspondingly provide the compressed signal output; and means for transmitting the AR parameters of levels 1 to M plus the sample points of level M including the signal power value of each such level.

2. The signal compression system as in claim 1, wherein M=3, further characterized in that said means for combining is responsive to those ones of the N/8 level 4 sample points that correspond to said first sample points of level 1 and the AR parameters of levels 1, 2, and 3 to provide the compressed signal output.

3. The system of claim 1, wherein said input signal comprises a bandwidth B and where said defined frequency is at least 2B.

4. The system of claim 1, wherein said means for deriving AR level 1 parameters further comprises means for deriving a weighted variance parameter.

5. The system of claim 4, wherein M=3, and wherein said means for combining further combines level 4 sample points with level 1, level 2, and level 3 AR parameters and said weighted variance parameter to provide said compressed signal output.

6. The system as in claim 1, wherein said means for deriving AR level 1 parameters further comprises means for deriving a weighted variance parameter and wherein said means for combining means for deriving a weighted variance parameter and wherein said means for combining provides a compressed signal output responsive to the level m+1 sample points and the AR levels 1, 2, . . . M parameters and said weighted variance parameter.

7. The system of claim 1, wherein the input signal is representative of at least one of speech, image, test, facsimile, audio, and video.

8. The system of claim 1, further characterized in that said input signal is representative of a transduced signal value of an originating external stimulus signal source.

9. The system of claim 8, further comprising:

input transducer means for converting the external stimulus signal source output into a digital signal for the transduced value to provide the input signal.

10. The system as in claim 1, further comprising means for transmitting the compressed signal output.

11. The system as in claim 10, further comprising means for receiving said compressed signal output.

12. The system as in claim 11, further comprising means for decompressing the received compressed signal output to reconstruct an approximation of the input signal.

13. The system as in claim 1, further comprising:

means for reconstructing an approximation of the input signal responsive to the level m+1 sample points and the level 1, 2, . . . M AR parameters.

14. The system as in claim 1, wherein each of the means for deriving AR parameters comprises an LS (least squares) identifier.

15. The system as in of claim 14, wherein the LS identifier comprises an SLS (sequential least squares) identifier.

16. A signal decompression system for reconstructing an approximation of an original signal from a compressed input signal comprising $N/2^M$ level M+1 sample points, and AR parameters for AR levels for each and all m levels, wherein M is a constant integer$\geqq$1, where N is an integer power of 2 and is at least 128, said system comprising:

reiterative means for reconstructing, reiteratively for each of the values k, $$\frac{N}{2^{(M-k)}}$$

level M−k+1 sample points from the $$\frac{N}{2^{(M-k+1)}}$$

level M−k+2 sample points and the AR level M−k+1 parameters, wherein k is an integer having an initial value of 1, and then from 2, . . . k, wherein k$\leqq$M−1;

means for reconstructing N level 1 sample points responsive to N/2 level 2 sample points as reconstructed by the reiterative means in combination with the AR level 1, 2, . . . M parameters from the compressed input signal; and means for providing an output representative of the approximation of said original input signal responsive to the level 1 sample points.

17. The system as in claim 16, wherein M=4; and k=1, 2, 3.

18. The system as in claim 17, wherein level 4 sample points are utilized to reconstruct level 3 sample points, level 3 sample points are utilized to reconstruct level 2 sample points, level 2 sample points are utilized to reconstruct level 1sample points, and the level 1 sample points are utilized to reconstruction the approximation of said original signal.

19. The system as in claim 16, wherein the compressed input signal further comprises a weighted variance parameter and wherein the approximation of said original input signal is reconstructed from the level 1 sample points and said weighted variance parameter.

20. The system as in claim 16, wherein said means for reconstructing further comprises means for utilizing the level M−k+1 sample points to reconstruct the level M−k sample points responsive to a reconstruction data point structure $D_1$, $D_2$, $D_3$, wherein each of the level M−k sample points is algorithmically computed responsive to two adjacent level M−k+1 sample points to algorithmically reconstruct level M−k sample points.

21. The system as in claim 20, wherein for a series of $Y_k$ sample points ($Y_k$, $Y_{k+1}$, $Y_{k+2}$, . . . );

wherein each sample point is reconstructed in accordance with $Y_k=(D_1*Y_{k-1})+(D_2*Y_{k-2})+(D_3*Y_{k-3})$;

wherein $D_1$, $D_2$, and $D_3$ are the AR parameters for the respective AR level of the respective level of the sample points; and wherein a predetermined $Y_k$ value is the $Y_{k-1}$ value.

22. The system as in claim 20, wherein the constants $D_1$, $D_2$, $D_3$ are predetermined in accordance with a predefined algorithm.

23. The system as in claim 21, wherein the means for reconstructing is responsive to the AR parameters and the sample points $Y_k$.

24. The system as in claim 21, wherein the means for reconstructing provides an initialization process comprising selecting a value for $Y_k$=0 for k=1, wherein for sample points wherein k=even, received data points are utilized directly, and wherein for k=odd, $Y_k=(D1*Y_{k-1})+(D2*Y_{k-2})+(D3*Y_{k-3})$.

25. The system as in claim 24, wherein said initialization process repeats until at least all of the level M−k+1 sample points have been reconstructed responsive to the level M−k actual sample points and the reconstructed sample points.

26. The system as in claim 25, wherein by utilizing the reconstructed level M−k+1 sample points, the level M−k sample points are correspondingly reconstructed.

27. The system as in claim 26, wherein an approximation of the original signal is reconstructed utilizing the reconstructed level 1 sample points.

28. The system as in claim 23, wherein for stochastically selected $Y_k$, a pseudo-white noise term $W_k$ is added to said computation of the reconstruction of $Y_k$.

29. The system as in claim 28, wherein the pseudo-white noise term is output from a pseudo-random generator table, wherein the resulting $Y_k$ is amplified by again element A to yield an amplified value of $W_k$ given by $A*W_k=W_{k*}$ to equate the power value of the level 1 reconstructed $Y_k$ to the power value of $Y_k$ prior to compression, and where the power value of $Y_k$ is the sum of $Y_k^2$ divided by N, with K ranging from 1 to N.

30. The system as in claim 29, wherein the power value of $Y_K$ is derived as $$P=\frac{1}{N}\sum_{k=1}^{N}Y_k^2$$

wherein P equals the power value and N equals the number of sample points in a data window.

31. A signal compression system for processing an input signal to provide an output of a compressed input signal, said system comprising:

means for dividing the input signal into a plurality of time windows comprising at least N=128 sample points;

means for sampling each said window at a plurality of points N at a defined sampling frequency to provide N level 1 sampling points;

means for deriving AR (autoregressive) model level 1 parameters including signal power value responsive to the N level 1 samples;

means for selecting every other one of the N level 1 sample points to provide N/2 level 2 sample points;

means for deriving AR level 2 parameters responsive to the N/2 level 2 sample points;

means for selecting every other one of the level 2 sample points to provide $N/2^2=N/4$ level 3 sample points;

means for deriving AR model level 3 parameters for the N/4 level 3 sample points;

means for selecting every other one of the level 3 sample points to provide $N/2^3=N/8$ level 4 sample points;

means for combining the $N/2^3$ level 4 sample points and the AR parameters of levels 1, 2, and 3 to provide a signal output of the compressed signal.

32. A signal decompression system for reconstructing an approximation of an original signal from a compressed input signal comprised of N/8 level 4 sample points, and AR parameters for AR levels 1, 2, and 3, where N is an integer power of 2 and is at least 128, said system comprising:

means for reconstructing N/4 level 3 sample points from the N/8 level 4 sample points and the AR level 3 parameters;

means for reconstructing N/2 level 2 sample points from the N/4 level 3 sample points and the AR level 2 parameters;

means for reconstructing N level 1 sample points responsive to the N/4 level 2 sample points and the AR level 1 parameters; and means for providing an output of the approximation of the original input signal responsive to the level 1 sample points.

* * * * *